(12) United States Patent
Goto

(10) Patent No.: US 8,168,926 B2
(45) Date of Patent: May 1, 2012

(54) HEATING DEVICE

(75) Inventor: Yoshinobu Goto, Nagoya (JP)

(73) Assignee: NGK Insulators, Ltd., Nagoya (JP)

( * ) Notice: Subject to any disclaimer, the term of this patent is extended or adjusted under 35 U.S.C. 154(b) by 1073 days.

(21) Appl. No.: 12/053,758

(22) Filed: Mar. 24, 2008

(65) Prior Publication Data

US 2008/0237216 A1 Oct. 2, 2008

(30) Foreign Application Priority Data

Mar. 26, 2007 (JP) ................................. 2007-079527

(51) Int. Cl.
*H05B 3/68* (2006.01)
(52) U.S. Cl. .................................. 219/461.1; 219/444.1
(58) Field of Classification Search .... 219/443.1–468.2, 219/538–548; 118/724, 725
See application file for complete search history.

(56) References Cited

U.S. PATENT DOCUMENTS

| | | | |
|---|---|---|---|
| 2,152,126 A * | 3/1939 | Young .......................... | 219/465.1 |
| 6,150,636 A * | 11/2000 | Bogdanski et al. ........ | 219/461.1 |
| 6,376,811 B2 * | 4/2002 | Yamaguchi et al. ....... | 219/468.1 |
| 6,423,949 B1 | 7/2002 | Chen et al. | |
| 6,617,553 B2 | 9/2003 | Ho et al. | |
| 6,646,235 B2 | 11/2003 | Chen et al. | |
| 7,279,661 B2 | 10/2007 | Okajima et al. | |
| 2003/0075537 A1 * | 4/2003 | Okajima et al. ........... | 219/444.1 |

FOREIGN PATENT DOCUMENTS

| | | |
|---|---|---|
| JP | 2003-059848 A1 | 2/2003 |
| JP | 2003-133195 A1 | 5/2003 |

* cited by examiner

*Primary Examiner* — Sang Paik
(74) *Attorney, Agent, or Firm* — Burr & Brown

(57) ABSTRACT

A first heating element and a second heating element, which are capable of individually controlling temperatures thereof, are embedded in a ceramic base. Each of the first heating element and the second heating element is formed into a spiral shape so as not to contact the other from a central portion of the base to an outer circumferential portion thereof in substantially the same plane parallel to a heating surface of the base. One of the first and second heating elements includes a high heating density portion on the central portion side of the base, and a low heating density portion on the peripheral portion side of the base, and the other of the first and second heating elements includes a low heating density portion on the central portion side of the base, and a high heating density portion on the peripheral portion side of the base.

6 Claims, 2 Drawing Sheets

HEATING DEVICE

CROSS REFERENCE TO RELATED APPLICATIONS

This application is based upon and claims the benefit of priority from Patent Application No. 2007-079527 filed on Mar. 26, 2007; in the Japanese Patent Office, of which contents are incorporated herein by reference.

BACKGROUND OF THE INVENTION

1. Field of the Invention

The present invention relates to a heating device, and more specifically, relates to a heating device for heating a wafer to be used as a substrate in a manufacturing process of a semiconductor device or heating other plate-like heating object.

2. Description of the Related Art

In a manufacturing process of a semiconductor device, heating treatment is implemented for forming an insulating film and the like on a wafer by using a semiconductor manufacturing apparatus. Among heating devices for heating the wafer in this semiconductor manufacturing apparatus, there is a heating device that includes a disc-like ceramic base having a heating surface for mounting the wafer thereon and heating the wafer, in which a heating element is provided in the ceramic base. This heating device is applied not only to a deposition step in the semiconductor manufacturing process but also advantageously to a surface treatment step of performing dry etching for a surface of the wafer by a plasma atmosphere and the like, and to the like.

In the deposition step and surface treatment step of the wafer, a heating temperature of the wafer and temperature uniformity in the surface of the wafer affect properties of a coated film deposited on the wafer and properties of the etched surface of the wafer, and as a result, affect characteristics and yield of the semiconductor device. Hence, it is required that heating of the heating device be controlled so that the wafer can be heated uniformly in the surface thereof at a predetermined temperature at the time of the deposition step of the wafer and the time of the surface treatment step thereof.

Accordingly, among such heating devices in each of which the heating element is provided in the ceramic base, there is a heating device, in which resistance heating elements are embedded individually in a central portion and a peripheral portion in an inside of the ceramic base, and it is possible to control heat generation of the resistance heating element in the central portion of the ceramic base and heat generation of the resistance heating element in the peripheral portion thereof independently of each other.

With regard to the heating device as described above, there is a multizone resistance heater, in which a first heating element is disposed in a first plane in an inside of a body of a stage, and a second heating element is disposed in a second plane more apart from a surface of the stage than the first plane in the inside of the body of the stage (Japanese Patent Laid-Open Publication No. 2003-59848).

Moreover, there is a heating device, in which, in the same plane in the base, the first heating element is provided in the peripheral portion of the heater, and the second heating element is provided in the central portion of the heater (Japanese patent Laid-Open Publication No. 2003-133195).

However, in the heating device as described in Japanese Patent Laid-Open Publication No. 2003-59848, in which the first heating element and the second heating element are provided in the different planes in the base, the heating elements are embedded in the two different layers in the base, and accordingly, the number of manufacturing steps of the heating device is increased, and a disadvantage has been brought from a viewpoint of productivity. Moreover, since the base is thickened, a heat capacity of the base is increased, and there is an apprehension that thermal responsiveness thereof when the temperature rises and drops may be decreased.

Moreover, in the heating device as described in Japanese Patent Laid-Open Publication No. 2003-133195, in which, in the same plane in the base, the first heating element is provided in the peripheral portion of the heater, and the second heating element is provided in the central portion of the heater, with regard to a temperature distribution from the central portion of the base to such an outer circumferential portion thereof, a temperature distribution in which a temperature change is extremely large is prone to occur, and a large thermal stress sometimes occurs in the base. In particular, when this base is made of ceramics, there has been an apprehension that a breakage may occur therein owing to the large thermal stress.

This invention has been made in order to advantageously solve the above-described problems. It is an object of this invention to provide a heating device capable of uniformly heating the base without increasing the thickness of the base or without increasing the thermal stress that occurs in the base.

SUMMARY OF THE INVENTION

A heating device of the present invention, which achieves the above-described object, includes: a base having a heating surface, which is made of ceramics; and a first heating element and a second heating element, which are embedded in the base, and are capable of individually controlling temperatures thereof, wherein each of the first heating element and the second heating element is formed into a spiral shape so as not to contact the other from a central portion of the base to an outer circumferential portion of the base in substantially a same plane parallel to the heating surface of the base, and one of the first heating element and the second heating element includes a high heating density portion on the central portion side of the base, and a low heating density portion on the peripheral portion side of the base, and the other of the first heating element and the second heating element includes a low heating density portion on the central portion side of the base, and a high heating density portion on the peripheral portion side of the base.

In accordance with the heating device of the present invention, the heating elements are formed into the spiral shape in substantially the same plane in the base. Accordingly, it is possible to achieve a heating device, in which the thickness of the base can be reduced, the breakage owing to the thermal stress is suppressed, and uniform heating performance is excellent.

BRIEF DESCRIPTION OF THE DRAWINGS

The above and further objects, features and advantages of the invention will be more fully appear in the detailed description of embodiments of the invention, when the same is read in conjunction with the drawings, in which.

DETAILED DESCRIPTION OF THE INVENTION

A description will be made of embodiments of a heating device of the present invention by using the drawings.

Figure 1:
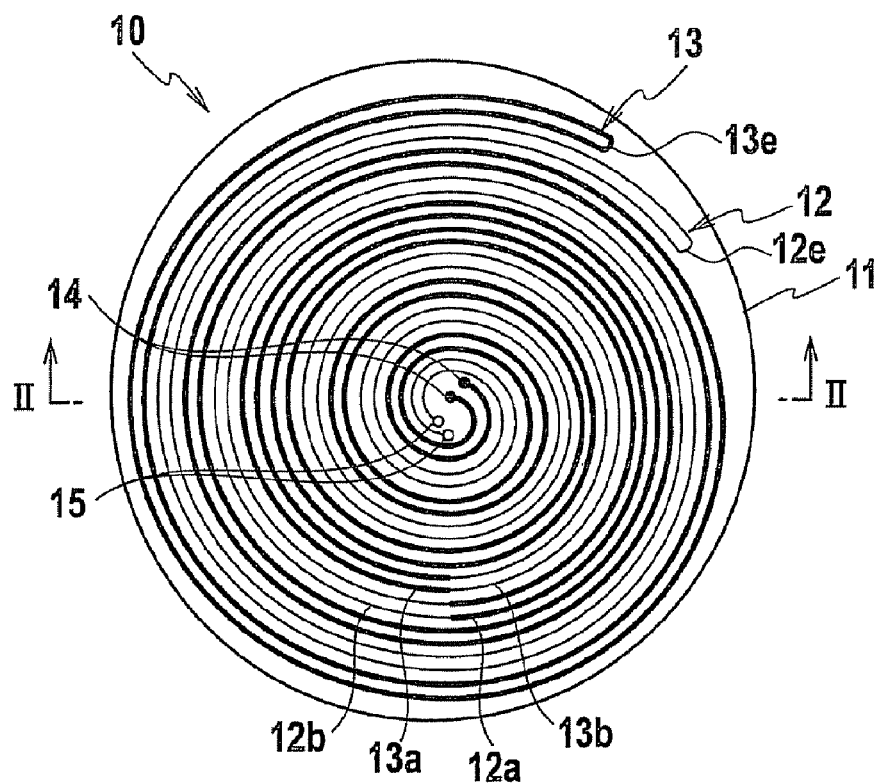
FIG. 1 is a schematic lateral cross-sectional view of a base in an embodiment of a heating device according to the present invention.
Figure 2:
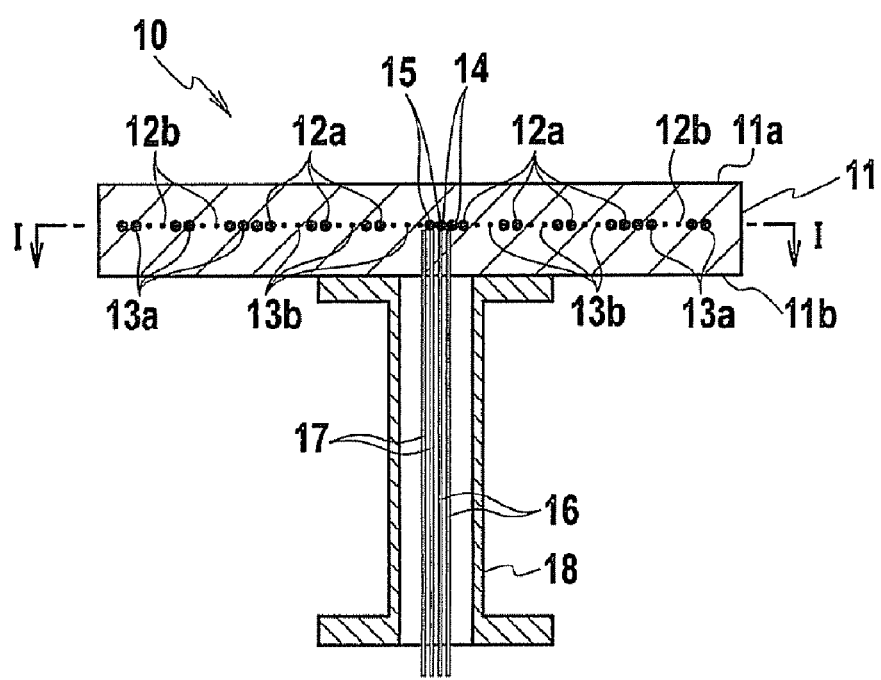
FIG. 2 is a schematic longitudinal cross-sectional view of the heating device shown in FIG. 1.

FIG. 1 is a schematic lateral cross-sectional view of a base in a heating device of an embodiment of the present invention, showing a cross section cut along a line I-I of FIG. 2. FIG. 2 is a schematic longitudinal cross-sectional view of the heating device of this embodiment, which includes the base shown in FIG. 1, showing a cross section cut along a line II-II of FIG. 1. The heating device 10 shown in FIG. 1 and FIG. 2 includes the disc-like base 11 made of ceramics. One plane of the base 11 is a heating surface 11a as shown in FIG. 2, and on the heating surface 11a, a heating object (not shown) such as a semiconductor wafer is mounted and heated. In this embodiment shown in FIG. 1 and FIG. 2, for the purpose of heating the heating object mounted on the heating surface 11a, a first heating element 12 and a second heating element 13 are embedded in the same plane substantially parallel to the heating surface 11a in an inside of the base 11. Both of the first heating element 12 and the second heating element 13 are resistance heating elements, and generate heat by being energized.

As shown in FIG. 1, in the plane parallel to the heating surface 11a of the base 11, each of the first heating element 12 and the second heating element 13 is formed into a spiral shape so as not to contact the other from a central portion of the base 11 to a peripheral portion thereof. More specifically, the first heating element 12 is composed in such a manner that two linear heating elements individually connected to two terminals 14 provided in the central portion of the base 11 form spirally curved shapes in the above-described plane so as to be adjacent to each other, and that these linear heating elements are connected to each other at a folded portion 12e in the vicinity of the peripheral portion of the base 11. In a similar way, the second heating element 13 is composed in such a manner that two linear heating elements individually connected to two terminals 15 provided in the central portion of the base 11 form spirally curved shapes in the above-described plane so as to be adjacent to each other and not to contact the liner heating elements of the above-described first heating element 12, and that these linear heating elements are connected to each other at a folded portion 13e in the vicinity of the peripheral portion of the base 11.

Each of the first heating element 12 and the second heating element 13 is composed so that a heating density can be different between a portion thereof provided on the central portion side of the base 11 in the above-described plane and a portion thereof provided on the peripheral portion side of the base 11 therein. In this embodiment shown in FIG. 1 and FIG. 2, the first heating element 12 includes, on the central portion side of the base 11, a high heating density portion 12a drawn by thick lines in the drawings, and includes, on the peripheral portion side of the base 11, a low heating density portion 12b drawn by thin lines in the drawings, in which a heating density is lower than that of the high heating density portion 12a. As opposed to this, the second heating element 13 includes, on the central portion side of the base 11, a low heating density portion 13b drawn by thin lines in the drawings, and includes, on the peripheral portion side of the base 11, a high heating density portion 13a drawn by thick lines in the drawings, in which a heating density is higher than that of the low heating density portion 13b.

As shown in FIG. 2, for the purpose of supplying an electric current to the first heating element 12, two power feeding bars 16 are inserted toward the terminals 14 of the first heating element 12 from a back surface 11b of the base 11 on an opposite side with the heating surface 11a, and are individually connected to these terminals 14. In a similar way, for the purpose of supplying an electric current to the second heating element 13, two power feeding bars 17 are inserted toward the terminals 15 of the second heating element 13 from the back surface 11b of the base 11, and are individually connected to these terminals 15. These power feeding bars 16 and power feeding bars 17 are connected to a power supply (not shown). This power supply is made capable of controlling power to be supplied to the power feeding bars 16 and power to be supplied to the power feeding bars 17 independently of each other. From this fact, the first heating element 12 connected to the power feeding bars 16 and the second heating element 13 connected to the power feeding bars 17 are made capable of individually adjusting heating temperatures.

A hollow support member 18 for protecting these power feeding bars 16 and power feeding bars 17 and supporting the base 11 is fixedly attached onto a center portion of the back surface 11b of the base 11. This support member 18 is made of, for example, ceramics as the same type of material as that of the base 11. The power feeding bars 16 and the power feeding bars 17 are made to pass through a hollow portion of the support member 18. When the heating device 10 of the present invention is attached to a semiconductor manufacturing apparatus, an atmosphere in the hollow portion of the support member 18 is shielded from an atmosphere in the vicinity of the heating surface 11a by the support member 18. Accordingly, the power feeding bars 16 and the power feeding bars 17, which are provided in the hollow portion of the support member 18, are not exposed to a corrosive atmosphere in the vicinity of the heating surface 11a when the heating object is heated, and therefore, the power feeding bars 16 and the power feeding bars 17 are prevented from being corroded.

As described above, in the heating device 10 of this embodiment, in the inside of the base 11, the first heating element 12 and the second heating element 13 are provided in the same plane substantially parallel to the heating surface 11a of the base 11. Therefore, as compared with a heating device in which a plurality of the heating elements are individually provided in different planes in the base like a conventional heating device, the base 11 can be thinned. In such a way, a weight of the device can be reduced, and moreover, a heat capacity of the base is reduced, thus making it possible to enhance thermal responsiveness thereof when the temperature rises and drops by the heating elements. Furthermore, it becomes possible to simplify a manufacturing process of the base.

As described above, the first heating element 12 includes the high heating density portion 12a on the central portion side of the base 11, and includes, on the peripheral portion side of the base 11, the low heating density portion 12b in which the heating density is lower than that of the high heating density portion 12a. By this disposition, when the first heating element 12 is energized, the temperature of the central portion on the heating surface 11a of the base 11 can be raised more than the temperature of the peripheral portion thereon. On the other hand, the second heating element 13 includes the low heating density portion 13b on the central portion side of the base 11, and includes, on the peripheral portion side of the base 11, the high heating density portion 13a in which the heating density is higher than that of the low heating density portion 13b. By this disposition, when the second heating element 13 is energized, the temperature of the peripheral portion on the heating surface 11a of the base 11 can be raised more than the temperature of the central portion thereon. In the heating device 10 of this embodiment, the first heating element 12 and the second heating element 13 are combined. Accordingly, a power to be supplied to the first heating element 12 and another power to be supplied to the second heating element 13 are adjusted by the power supply independently of each other, whereby a heating value of the central portion on the heating surface 11a of the base 11 and a heating value of the peripheral portion thereon can be controlled from the central portion hotter to colder than the peripheral portion. In such a way, the heating device 10 of this embodiment performs a control to reduce a temperature difference between the central portion on the heating surface 11a and the peripheral portion thereon, thus making it possible to enhance uniform temperature distribution of the heating device 10 itself. Moreover, the heating device 10 of this embodiment is also capable of arbitrarily changing a temperature gradient from the central portion of the base to the peripheral portion thereof by the above-described adjustment of the powers. Accordingly, for example, the heating device 10 is capable of creating such a temperature distribution that the temperature of the peripheral portion is higher by 10° C. than the temperature of the central portion, and that the temperature of the peripheral portion is lower by 5° C. than the temperature of the central portion.

The low heating density portion 13b on the central portion side of the second heating element 13 and the high heating density portion 13a on the peripheral portion side thereof are not always limited to the illustrated ones obtained by simply dividing the second heating element 13 into two heating density portions. The second heating element of the heating device of the present invention stands for the one in which the heating density is increased continuously or step by step from the central portion of the base to the peripheral portion thereof. In such a case where a hole is formed in the base, the heating density of the second heating element on a portion located in the vicinity of the hole concerned is sometimes increased. On the contrary, the first heating element 12 stands for the one in which the heating density is decreased continuously or step by step from the central portion of the base to the peripheral portion thereof.

Moreover, in the heating device 10 of this embodiment, each of the first heating element 12 and the second heating element 13 is formed into the spiral shape so as not to contact the other. From this fact, as compared with the conventional heating device in which the heating element that heat the central portion of the base and the heating element that heats the peripheral portion thereof are individually provided, the heating device 10 of this embodiment can smoothen such an in-plane temperature distribution of the heating surface 11a, which is created by adjusting the powers to be supplied to the first heating element 12 and the second heating element 13. Hence, a thermal stress owing to the temperature difference in the base 11 can be decreased. Moreover, the heating device 10 of this embodiment can finely adjust the temperature distribution between the central portion and peripheral portion of the base 11, and hence, can precisely heat the heating object mounted on the heating surface 11a.

The base 11 of the heating device 10 of this embodiment be made of ceramics. When ceramics is used for the base material, the heater has excellent corrosion resistance and high temperature endurance. On the other hand, conventionally there was a possibility that the base may break owing to the thermal stress depending on heating conditions. However, in this point, in accordance with the heating device 10 of this embodiment, the generated thermal stress can be decreased. Accordingly, the apprehension that the base 11 may break owing to the thermal stress is small even if the base 11 is made of the ceramics, whereby the effect of the heating device of the present invention will be more apparent.

A type of the ceramics of the base 11 is not particularly limited. For example, nitride ceramics such as aluminum nitride ceramics, silicon nitride ceramics, boron nitride ceramics and sialon ceramics; oxide ceramics such as alumina ceramics; carbide ceramics such as silicon carbide ceramics; alumina-silicon carbide composite ceramics, and the like can be applied. However, aluminum nitride is the best for the base material in this embodiment. Since aluminum nitride has higher thermal conductivity and high resistivity, more preferable temperature distribution can be achieved with this embodiment.

A shape of the base 11 is not particularly limited; however, it is preferable that the shape be disc-like since that the shape is disc-like is suitable for heating the semiconductor wafer as the heating object. A shape of the heating surface 11a of the base 11 is not limited to the case where the shape is planar. For example, the heating surface 11a can also be formed into a pocket shape having a recessed portion corresponding to a size of the semiconductor wafer on a central portion thereof, an embossed shape having micro protrusions on a surface thereof, and a grooved shape in which micro grooves are formed on a surface.

The base 11 can be manufactured by publicly known methods. Among the methods, it is preferable to apply a hot press method and a hot isostatic press (HIP) method.

For the first heating element 12 and the second heating element 13, which are embedded in the base 11, resistance heating coils can be used, and moreover, resistance heating elements obtained by a printing method can also be used. Besides the above, such forms of mesh, ribbon, punching metal and the like are also usable for the heating elements. In the heating device 10 of this embodiment, the first heating element 12 and the second heating element 13 include the high heating density portions 12a and 13a, and the low heating density portions 12b and 13b. In the case of using the resistance heating coils as the heating elements, the high heating density portions 12a and 13a and the low heating density portions 12b and 13b can be realized by differentiating a coil pitch between the high heating density portions and the low heating density portions. Moreover, in the case of using the resistance heating elements obtained by the above-described printing method, the high heating density portions 12a and 13a and the low heating density portions 12b and 13b can be realized by differentiating at least either one of a line width and thickness of the resistance heating elements obtained by the coating between the high heating density portions and the low heating density portions.

A material of the first heating element 12 and the second heating element 13 is not particularly limited as long as it is usable as the resistance heating elements. For example, high-melting-point metal materials such as tantalum, tungsten, molybdenum, platinum, rhenium and hafnium, and alloys of these can be used. Moreover, besides the above-described metal materials, conductive materials such as carbon, TiN and TiC can be used. However, molybdenum is the most preferable for aluminum nitride ceramics of this embodiment since the thermal expansion coefficient of molybdenum is very similar to that of aluminum nitride.

It is necessary that the first heating element 12 and the second heating element 13 be formed so as not to overlap each other in substantially the same plane when viewed in the thickness direction from the heating surface 11a of the base 11. It is not required that a plane where the first heating element 12 is formed and a plane where the second heating element 13 is formed be the same plane in a geometrically strict meaning. An industrial error on manufacture is allowed, and such an error margin between the planes is preferably 3 mm or less, more preferably 1 mm or less.

It is preferable that the plane where the first heating element 12 is formed and the plane where the second heating element 13 is formed be planes substantially parallel to the heating surface 11a of the base 11 from a viewpoint of enhancing the uniform heating performance and the temperature controllability. The term "substantially parallel" is one to allow such a manufacturing error, and includes the case where there is a difference of inclination of approximately 5° between both of the above-described planes.

The spiral shape of each of the first heating element 12 and the second heating element 13 is not limited to the example shown in FIG. 1, and a large number of modification examples are possible depending on the number of turns, a direction of the spiral, a wiring pattern, and the like.

The embodiment shown in FIG. 1 and FIG. 2 is an example where each of the first heating element 12 and the second heating element 13 includes two portions where the heating densities largely differ from each other in the central portion and peripheral portion of the base. However, each of the first heating element 12 and the second heating element 13 can also be formed so as to include three or more portions different in heating density from the central portion of the base to the peripheral portion thereof. Moreover, also in the example where each of the first heating element 12 and the second heating element 13 includes the two portions where the heating densities largely differ from each other in the central portion and peripheral portion of the base, a configuration can also be adopted, in which the central portion is further divided to form portions where the heating densities are differentiated from each other, whereby heat radiation from a joint portion between the base 11 and the support member 18 and from the terminals 14 and 15 can be corrected. In a similar way, the peripheral portion can also be further divided to form such portions where the heating densities are differentiated from each other.

Moreover, the present invention is not limited to the case where only the first heating element 12 and the second heating element 13 are provided as the heating elements. For example, one or more heating elements are added to these heating elements, and each of all the heating elements is formed into the spiral shape so as not to contact the others from the central portion of the base 11 to the outer circumferential portion thereof.

It is preferable that the terminals 14 connected to the first heating element 12 and the terminals 15 connected to the second heating element 13 be provided in the central portion of the base 11 as shown in FIG. 2. The terminals 14 and the terminals 15 are provided in the central portion of the base 11, whereby the power feeding bars 16 and the power feeding bars 17, which are connected to the terminals 14 and the terminals 15, respectively, can be provided in a central portion of the back surface 11b of the base 11. This is the reason that the terminals 14 and 15 are preferably provided in the central portion of the base 11. The power feeding bars 16 and the power feeding bars 17 are provided in the central portion of the back surface 11b of the base 11, whereby these power feeding bars 16 and power feeding bars 17 are inserted into the hollow portion of the hollow support member 18 attached onto the central portion of the back surface 11b of the base 11. Accordingly, at the time of heating treatment, the power feeding bars 16 and the power feeding bars 17 can be shielded from the corrosive atmosphere in the vicinity of the heating surface 11a by sidewall portions of the hollow support member 18. Hence, durability of the power feeding bars 16 and the power feeding bars 17, which are inserted into the hollow portion of the hollow support member 18, is enhanced.

As a material of the terminals 14 and the terminals 15, preferable are a high-melting-point material that is the same as the material of the heating elements, and nickel. Moreover, a shape of the terminals is not particularly limited, and can be a columnar shape and other shapes.

The connection between the terminals 14 and the first heating element 12 and the connection between the terminals 15 and the second heating element 13 can be made by brazing and the like. Moreover, the connection between the terminals 14 and the power feeding bars 16 and the connection between the terminals 15 and the power feeding bars 17 can also be made by the brazing and the like.

The power feeding bars 16 connected to the terminals 14 and the power feeding bars 17 connected to the terminals 15 are not limited to the example of being rods, but also may be wires or composites of the rods and the wires. A material of the power feeding bars 16 and the power feeding bars 17 is not limited, either. These power feeding bars are isolated from the corrosive atmosphere in the vicinity of the heating surface by the hollow support member 18, and are less likely to be corroded, and accordingly, are not limited to a material having good corrosion resistance. The material of the power feeding bars 16 and the power feeding bars 17 is preferably metal, particularly preferably the nickel.

It is preferable that the above-described hollow support member 18 be provided on the back surface 11b of the base 11 in order to house the power feeding bars 16 and the power feeding bars 17 therein and to support the base 11. The heating device 10 includes the support member 18, whereby the heating device 10 can be easily attached to the semiconductor manufacturing apparatus (not shown) When the heating device 10 is attached to the semiconductor manufacturing apparatus, since the heating device of the present invention can thin the base 11 as described above, a weight of the base 11 is reduced, thus making is possible to support the base 11 by the support member 18 more easily. Moreover, since the power feeding bars 16 and the power feeding bars 17 are housed in the hollow portion of the support member 18, the corrosion of the power feeding bars 16 and the power feeding bars 17 can be prevented as mentioned above, and further, corrosion of the terminals 14 and the terminal 15 can also be prevented.

A material of the support member 18 is not particularly limited; however, it is preferable that the support member 18 be made of the same types of ceramics as the ceramics composing the base 11. When the support member 18 is made of the same type of ceramics as that of the base 11, thermal expansion coefficients of both thereof become substantially the same, and a thermal stress that occurs in the joint portion between the support member 18 and the base 11 is small. Hence, a breakage can be suppressed from occurring in the joint portion concerned. This is the reason that the support member 18 is preferably made of the same type of ceramics as that of the base 11.

The support member 18 and the base 11 can be bonded to each other by publicly known methods, for example, by brazing bonding and solid-phase bonding.

It is preferable that the support member 18 be bonded to the central portion of the back surface 11b of the base 11. The support member 18 is bonded to the central portion of the back surface 11b of the base 11, whereby a heat transfer region from the base 11 to the support member becomes the central portion of the base 11, thus making it possible to maintain good uniform heating performance by combination of the support member 18 concerned and the plurality of heating elements embedded in the base 11.

Figure 3:
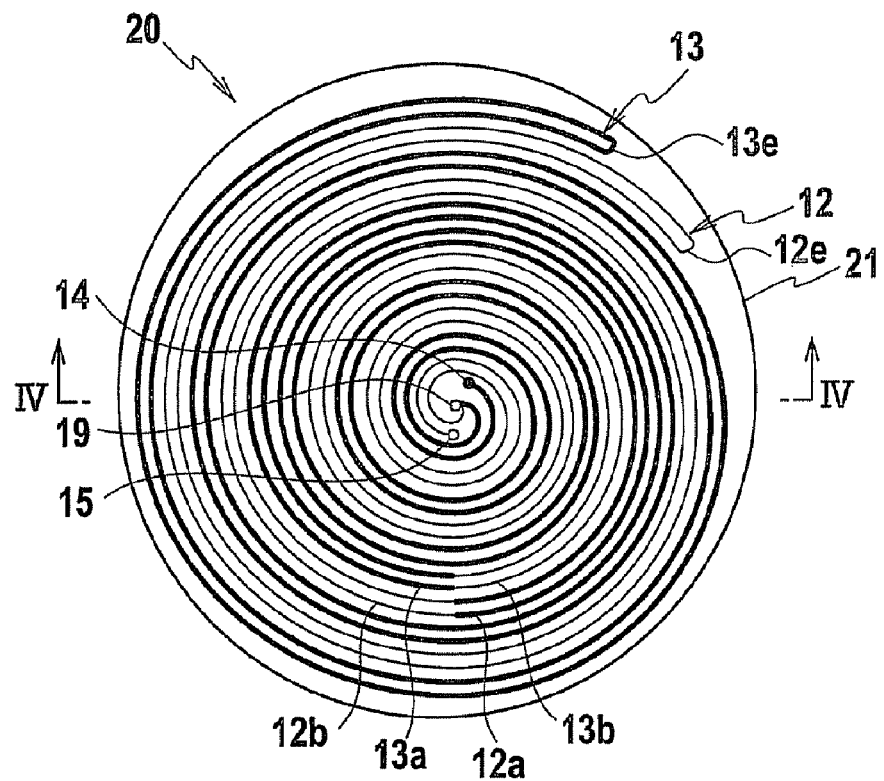
FIG. 3 is a schematic lateral cross-sectional view of a base in another embodiment of the heating device according to the present invention.
Figure 4:
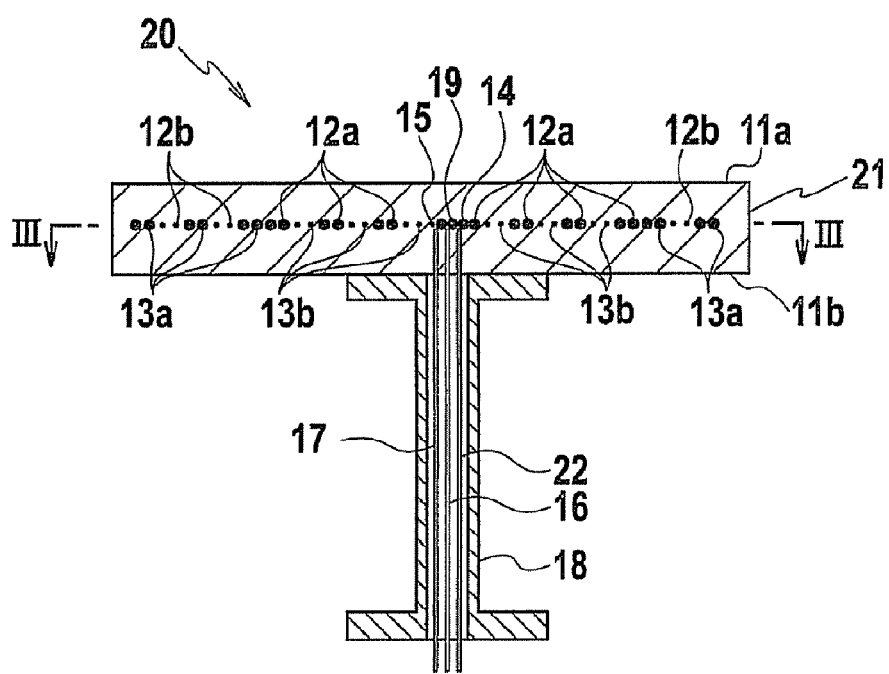
FIG. 4 is a schematic longitudinal cross-sectional view of the heating device shown in FIG. 3.

Another embodiment of the heating device according to the present invention is shown in FIG. 3 and FIG. 4. FIG. 3 is a lateral cross-sectional view of a base 21 in the other embodiment of the heating device 20, showing a cross section cut along a line III-III of FIG. 4. FIG. 4 is a longitudinal cross-sectional view of the heating device 20 shown in FIG. 3, showing a cross section cut along a line IV-IV of FIG. 3. Note that, in FIG. 3 and FIG. 4, the same reference numerals are assigned to the same members as the members shown in FIG. 1 and FIG. 2, and a duplicate description will be omitted below.

A heating device 20 shown in FIG. 3 and FIG. 4 is different from the heating device 10 shown in FIG. 1 and FIG. 2 in the following points. The heating device 20 includes a common terminal 19, in which one of the two terminals connected to the first heating element 12 and one of the two terminals connected to the second heating element 13 are shared, in a central portion of the base 21. Then, the two linear heating elements composing the first heating element 12 are individually connected to the terminal 14 and the common terminal 19, and the two linear heating elements composing the second heating element 13 are individually connected to the terminal 15 and the common terminal 19.

A shared power feeding bar 20 is connected to this common terminal 19. Hence, in the heating device 20 shown in FIG. 3 and FIG. 4, electrode bars housed in the hollow portion of the support member 18 are totally three, which are: the power feeding bar 16 connected to the terminal 14 connected to the first heating element; the power feeding bar 17 connected to the terminal 15 connected to the second heating element; and a shared power feeding bar 22 connected to the common terminal. As opposed to this, in the heating device 10 shown in FIG. 1 and FIG. 2, electrode bars housed in the hollow portion of the support member 18 are totally four, which are: the two power feeding bars 16 individually connected to the two terminals 14 connected to the first heating element; and the two terminals 17 individually connected to the two terminals 15 connected to the second heating element. Hence, as compared with the heating device 10 shown in FIG. 1 and FIG. 2, the heating device 20 shown in FIG. 3 and FIG. 4 can reduce the number of electrodes housed in the hollow portion of the support member 18. Accordingly, the support member 18 can be designed to be more compact. If a diameter of the support member can be reduced, then a degree of freedom in design is increased, and in addition, it is also possible to reduce a thermal stress acting on a joint portion between the base 21 and the support member 18.

EXAMPLES

Example 1

The heating device 10 having the structure shown in FIG. 1 and FIG. 2 was fabricated. The base 11 was fabricated so as to have a diameter of 320 mm and a thickness of 10 mm. Aluminum nitride was used as the material of the base 11. In the inside of the base 11, the first heating element 12 and the second heating element 13 (made of molybdenum as the material thereof and formed of coil-like heating elements) were individually embedded in the base 11 in the wiring pattern shown in FIG. 1. The first heating element 12 was formed so as to include the high heating density portion 12a on the central portion side of the base 11, and to include, on the peripheral portion side of the base 11, the low heating density portion 12 in which the heating density is lower than that of the high heating density portion 12a. The second heating element 13 was formed so as to include the low heating density portion 13b on the central portion side of the base 11, and to include, on the peripheral portion side of the base 11, the high heating density portion 13a in which the heating density is higher than that of the low heating density portion 13b.

The hollow support member 18 was subjected to the solid-phase bonding to the central portion of the back surface 11b of the base 11. Moreover, the power feeding bars 16 and the power feeding bars 17 were connected through the hollow portion of the hollow support member 18 to the terminals 14 and 15 in the base 11.

A semiconductor wafer was heated by using the heating device 10 thus fabricated. Then, when a set temperature was 700° C., the temperature distribution ($\Delta T$) on the heating surface 11a of the base 11 became equal to 5° C., and good uniform heating performance was able to be achieved by supply of the powers to be supplied to the first heating element and the second heating element.

Example 2

The heating device 20 having the structure shown in FIG. 3 and FIG. 4 was fabricated. The heating device 20 of this example was different from the heating device 10 of Example 1 in the following points. The heating device 20 includes the common terminal 19 in which one of the two terminals connected to the first heating element 12 and one of the two terminals connected to the second heating element 13 are shared. Moreover, in the heating device 20, the shared power feeding bar 22 is connected to this common terminal. The heating device 20 is similar to the heating device 10 of Example 1 except these points.

A semiconductor wafer was heated by using the heating device 20 thus fabricated. Then, when the set temperature was 700° C., the temperature distribution ($\Delta T$) on the heating surface 11a of the base 11 became equal to 4° C., and better uniform heating performance than the heating device 10 having the structure shown in FIG. 1 and FIG. 2 was able to be achieved. In general, when the semiconductor wafer was heated by the heating device, the terminals provided in the base did not generate heat, and heat radiation from the terminals to the power feeding bars occurred. Hence, a cool spot on the heating surface of the base was prone to occur in the vicinity of the terminals. However, as compared with the heating device 10 shown in FIG. 1 and FIG. 2, the heating device 20 of the example 2 reduced the number of electrodes, and reduced the occurrence of the cool spot. Therefore, the heating device 20 of the example 2 had better uniform heating performance than the heating device 10 having the structure shown in FIG. 1 and FIG. 2.

The description has been made above of the embodiments of the heating device according to the present invention by using the drawings. However, the heating device according to the present invention is not limited to the illustrated embodiments, and a large number of modifications are possible within the scope of the gist of the present invention. For example, the heating device may be the one in which not only the first heating element and the second heating element but also a dielectric electrode for generating electrostatic force on the heating surface of the base and a high frequency electrode for producing a plasma atmosphere on the heating surface concerned are embedded in the base.

The description has been made above of the heating device of the present invention by using the embodiments and the drawings. However, the heating device of the present invention is not limited to these embodiments and drawings, and a large number of modifications are possible within the scope without departing from the gist of the present invention.

What is claimed is:

1. A heating device, comprising:
    a base having a heating surface, which is made of ceramics; and
    a first heating element and a second heating element, which are embedded in the base, and are capable of individually controlling temperatures thereof,
    wherein each of the first heating element and the second heating element is formed into a spiral shape so as not to contact the other from a central portion of the base to an outer circumferential portion of the base in substantially a same plane parallel to the heating surface of the base, and
    one of the first heating element and the second heating element includes a high heating density portion on the central portion side of the base, and a low heating density portion on the peripheral portion side of the base, and the other of the first heating element and the second heating element includes a low heating density portion on the central portion side of the base, and a high heating density portion on the peripheral portion side of the base.

2. The heating device according to claim 1, wherein the base is made of aluminum nitride, and the heating element is made of molybdenum.

3. The heating device according to claim 1, wherein a terminal connected to the first heating element and a terminal connected to the second heating element are individually provided in the central portion of the base, and
    a hollow support member is provided on a surface of the base on an opposite side with the heating surface, and is made of a same type of ceramics as a material of the base.

4. The heating device according to claim 1, wherein a common terminal in which one of two terminals connected to the first heating element and one of two terminals connected to the second heating element are shared is provided.

5. The heating device according to claim 2, wherein a terminal connected to the first heating element and a terminal connected to the second heating element are individually provided in the central portion of the base, and
    a hollow support member is provided on a surface of the base on an opposite side with the heating surface, and is made of a same type of ceramics as a material of the base.

6. A heating device, comprising:
    a base having a heating surface, which is made of ceramics; and
    a first heating element and a second heating element, which are embedded in the base, and are capable of individually controlling temperatures thereof,
    wherein each of the first heating element and the second heating element is formed into a spiral shape so as not to contact the other from a starting central portion of the base while extending spirally outwards to an outer circumferential portion of the base, and folded, so as not to contact the other from the outer circumferential portion of the base while also extending spirally inwards back to the starting central portion of the base, in substantially a same plane parallel to the heating surface of the base, and
    one of the first heating element and the second heating element includes a high heating density portion on the central portion side of the base, and a low heating density portion on the peripheral portion side of the base, and the other of the first heating element and the second heating element includes a low heating density portion on the central portion side of the base, and a high heating density portion on the peripheral portion side of the base.

* * * * *